(12) United States Patent
Chu (10) Patent No.: US 10,735,841 B2
(45) Date of Patent: Aug. 4, 2020

(54) DUAL-MODE ACOUSTIC RADIATOR SPEAKER SYSTEM

(71) Applicant: Walter Ka Wai Chu, Shatin (HK)

(72) Inventor: Walter Ka Wai Chu, Shatin (HK)

(73) Assignee: FAIF Designs Limited, Hong Kong (CN)

( * ) Notice: Subject to any disclaimer, the term of this patent is extended or adjusted under 35 U.S.C. 154(b) by 0 days.

(21) Appl. No.: 16/670,936

(22) Filed: Oct. 31, 2019

(65) Prior Publication Data

US 2020/0068281 A1     Feb. 27, 2020

Related U.S. Application Data (62) Division of application No. 16/352,282, filed on Mar. 13, 2019.

(60) Provisional application No. 62/642,026, filed on Mar. 18, 2018.

(51) Int. Cl.
| | |
|---|---|
| *H04R 1/02* | (2006.01) |
| *H04R 9/06* | (2006.01) |
| *H04R 1/28* | (2006.01) |
| *H04R 3/00* | (2006.01) |
| *H03F 3/181* | (2006.01) |

(52) U.S. Cl.
CPC ........... *H04R 1/025* (2013.01); *H04R 1/2803* (2013.01); *H04R 1/2834* (2013.01); *H04R 3/00* (2013.01); *H03F 3/181* (2013.01); *H03F 2200/03* (2013.01)

(58) Field of Classification Search
CPC .... H04R 1/025; H04R 1/2803; H04R 1/2834; H04R 3/00
See application file for complete search history.

(56) References Cited

U.S. PATENT DOCUMENTS

| | | | |
|---|---|---|---|
| 1,988,250 A | 1/1935 | Olson | |
| 5,608,810 A * | 3/1997 | Hall | ......................... H04R 7/12 |
| | | | 181/172 |
| 9,294,841 B2 | 3/2016 | Sahyoun | |
| 9,571,934 B2 | 2/2017 | Stabile | |
| 2001/0024509 A1* | 9/2001 | Carver | ................... H04R 1/227 |
| | | | 381/395 |
| 2014/0029782 A1* | 1/2014 | Rayner | ................ H04R 1/2896 |
| | | | 381/386 |

(Continued)

*Primary Examiner* — Simon King
(74) *Attorney, Agent, or Firm* — Christopher Pilling; Johan Eide; My Patent Guys (57) ABSTRACT

The present invention sets out to solve the problems above by presenting a dual-mode speaker system for acoustic reproduction. The dual-mode speaker system for acoustic reproduction presents a system with high-energy conversion efficiency and provides flexibility between an active speaker driver and other radiators, improved sound quality, a larger range of low frequency sounds, and the capability to improve audio frequency playback range in small-scale audio environments. A dual-mode acoustic radiator speaker system is provided having an enclosure with a plurality of openings, an active speaker driver having a first motor assembly and a dual-mode radiator having a second motor assembly. In some embodiments, the dual-mode acoustic radiator speaker system further comprises one or more passive radiators adjoined to the enclosure. Next, within the dual-mode acoustic radiator speaker system a power supply is connected to the electronic signal processing and amplification system.

12 Claims, 8 Drawing Sheets

(56) References Cited

U.S. PATENT DOCUMENTS

| | | | |
|---|---|---|---|
| 2014/0185838 A1* | 7/2014 | Chan | H04R 1/021 381/152 |
| 2015/0156572 A1* | 6/2015 | Li | H04R 1/28 381/386 |
| 2018/0054073 A1* | 2/2018 | Olson | H01R 13/631 |
| 2019/0222939 A1* | 7/2019 | Brunet | H04R 1/2834 |

* cited by examiner

DUAL-MODE ACOUSTIC RADIATOR SPEAKER SYSTEM

RELATED APPLICATION

This application claims priority to provisional patent application U.S. Ser. No. 62/642,026 filed on Mar. 13, 2018, entitled "Active/passive dual-mode acoustic radiators and the corresponding electronic systems", the disclosure of which is herein incorporated in its entirety at least by reference.

This is a divisional application of application U.S. Ser. No. 16/352,282, filed Mar. 13, 2019 and entitled "Dual-Mode Acoustic Radiator Speaker System", the disclosure of which is herein incorporated in its entirety at least by reference.

BACKGROUND

1. Field of the Invention

The present invention generally relates to an acoustic device, more particularly to a dual-mode acoustic radiator speaker system for acoustic reproduction and manipulation.

2. Description of Related Art

Passive radiators are well known in the art of audio systems and are simply a reactionary member of an audio system. Typically, a loud speaker driver of an audio system is mounted to a sealed enclosure and the physical movement of the driver increases or decreases an internal pressure of the sealed enclosure. Passive radiators adjoined to the same enclosure move in relation to the change in internal pressure of the system and aid the audio system in commonly producing lower or deeper tones within the audio system.

For example, audio systems utilizing passive radiators have been known in the art and are discussed in U.S. Pat. No. 1,988,250 to Olson. In this example, a loudspeaker for propagating sound is shown that utilizes multiple secondary diaphragms to lower the cutoff point of the low-frequency response in a common loudspeaker. Furthermore, other patents such as U.S. Pat. No. 9,294,841 to Sahyoun, disclose a further design where the speaker driver itself is mounted into a suspension system surrounding the speaker driver. Consequentially, not only does the speaker cone act as an acoustic radiating diaphragm but additionally, the whole speaker driver weight contributes as a moving diaphragm or a passive radiator. These common audio systems are limited in that the speaker driver and accompanying passive radiators or suspended speaker drivers are not independent and work in direct relation to each other. Other traditional audio systems, such as U.S. Pat. No. 9,571,934 to Stabile, utilize passive radiators or secondary diaphragms arranged in an opposing position to the speaker driver on the same enclosure, resulting in a consequential in-phase movement with the opposing speaker driver.

In the transfer of energy from a speaker driver to a common passive radiator or secondary diaphragm, the energy transfer coupling is undesirably inefficient. This is further limiting and even more inefficient in small-scale enclosures. Inefficiency in small-scale enclosures is typically due to the amount of physical space being limited in small-space enclosures, therein the moving-mass of the passive radiator should be large in small-space enclosures for adequate low-frequency sound reproduction. In any enclosure it is desirable for the passive radiator to have the most mass possible for adequate bass reproduction. For sound reproduced and radiating from a passive radiator, with the exception of the passive radiator's in-system resonance frequency, the energy conversion efficiency from the input electrical energy to the sound-radiating energy from the passive radiator is extremely low, usually less than 0.1% in most frequency ranges. This electrical-to-acoustical energy transfer efficiency is much higher in the frequency region close to passive radiator's in-system resonance frequency, due to a closer complex acoustic impedance matching within or close to the natural resonance frequency range of the passive radiator. The tremendous energy-loss is typically dissipated as heat in each of the energy transfer processes above due to acoustic impedance mismatch and voice-coil resistance. A solution is needed for providing the user with various power consumption level options and their respective bass reproduction levels within an audio system utilizing passive radiators, especially in small-scale audio environments.

BRIEF SUMMARY

The present invention sets out to solve the problems listed above by presenting a dual-mode acoustic radiator speaker system for acoustic reproduction. The dual-mode speaker system for acoustic reproduction presents a system with optional energy (power) consumption levels, optional bass reproduction levels, improved sound quality, a larger range of low-frequency sounds, and the capability to improve audio frequency playback range in small-scale audio environments.

One object of the current invention is to provide the user flexibility in the sound produced by the dual-mode speaker system. Deep bass sounds or low-frequency sounds are not always desired and allowing the user to manipulate a sound pressure level as desired within an enclosure gives flexibility and options to the user.

One object of the dual-mode speaker system is to produce deep bass in a moderate sound pressure level with a low power consumption. In some embodiments, the dual-mode speaker system utilizes lowest power consumption while having lower levels of bass reproduction. In this embodiment, dual-mode radiator is powered off and is working as a passive radiator and the bass production of the first active speaker driver is not powered at a high level. In some embodiments, the dual-mode speaker system utilizes low power consumption while producing higher bass reproduction. In this embodiment, the dual-mode speaker system has a lower maximum sound pressure level and a lower overall maximum volume level. In this embodiment, the dual-mode radiator is powered off and the bass production of the first active speaker driver is powered at a high level.

Another object of the dual-mode speaker system is to produce deep bass sound at a high sound pressure level under higher power consumption situations. In some embodiments, the dual-mode speaker system utilizes high power consumption and a high level of bass reproduction by supplying electrical signals to the dual-mode radiator. In this embodiment, the radiator acts as a high-mass low-efficiency woofer producing bass reproduction that adds to the bass reproduction of the first active speaker driver within the system.

Yet another object of the current invention is to utilize an electronic signal processing and amplification system to moderate and manipulate all components resonance frequencies to deliver the desired resonance frequency within the entire enclosure, as well as the desired sound pressure level within the internal volume of the enclosure.

In order to do so, a dual-mode speaker system is provided, comprising an enclosure with a plurality of openings, an active speaker driver having a first motor assembly and a dual-mode radiator having a second motor assembly. In some embodiments, the dual-mode acoustic radiator speaker system further comprises one or more passive radiators adjoined to the enclosure. Next, within the dual-mode acoustic radiator speaker system, a power supply is connected to the electronic signal processing and amplification system.

BRIEF DESCRIPTION OF THE FIGURES

The detailed description of some embodiments of the invention is made below with reference to the accompanying figures, wherein like numerals represent corresponding parts of the figures.

The novel features of the disclosure are set forth with particularity in the appended claims. A better understanding of the features and advantages of the present disclosure will be obtained by reference to the following detailed description that sets forth illustrative embodiments, in which the principles of the disclosure are utilized, and the accompanying drawings of which:

DETAILED DESCRIPTION OF THE PREFERRED EMBODIMENT

While preferred embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure.

Referring to any of the accompanying FIGS. 1-8, a dual-mode acoustic radiator speaker system 100 for acoustic reproduction is provided. The dual-mode acoustic radiator speaker system 100 comprises an enclosure 180 having an exterior shell and an internal volume. The enclosure 180 includes a plurality of openings protruding through the exterior shell of the enclosure 180, wherein an active speaker driver 103 having a first motor assembly 165 and a dual-mode radiator 101 having a second motor assembly 145 are each aligned within the different openings of the plurality of openings of the enclosure 180. In some embodiments, the dual-mode acoustic radiator speaker system 100 further comprises one or more passive radiators 102, wherein the one or more passive radiators 102 are adjoined to the enclosure 180 and concentrically aligned within one of the plurality of openings of the enclosure 180. In some embodiments, the one or more passive radiators 102 are symmetrically aligned on a face of the enclosure 180 within one of the plurality of openings of the enclosure 180. In some embodiments, the enclosure 180 further comprises a port protruding through the exterior shell of the enclosure 180.

Next, within the dual-mode acoustic radiator speaker system 100 a power supply (not shown) is connected to an electronic signal processing and amplification system 185 185. In some embodiment, the electronic signal processing and amplification system 185 is joined to the enclosure 180. In some embodiment, the electronic signal processing and amplification system 185 is connected to the active speaker driver 103 and the dual-mode radiator 101 separately. In some embodiments, the electronic signal processing and amplification system 185 is adjoined within the enclosure 180. In some embodiments, the electronic signal processing and amplification system 185 is adjoined an outer surface of the exterior shell of the enclosure 180. The dual-mode radiator 101 is coupled to the electronic signal processing and amplification system through a first connection 150. The active speaker driver 103 is coupled to the electronic signal processing and amplification system 185 through a second connection 175. In some embodiments, the electronic signal processing and amplification system 185 is further communicatively coupled to an input device (not shown). The input device is coupled to the electronic signal processing and amplification system 185 and configured to receive an input. In some embodiments, the dual-mode acoustic radiator speaker system 100 further comprises a plurality of dual-mode radiators 101.

Figure 8:
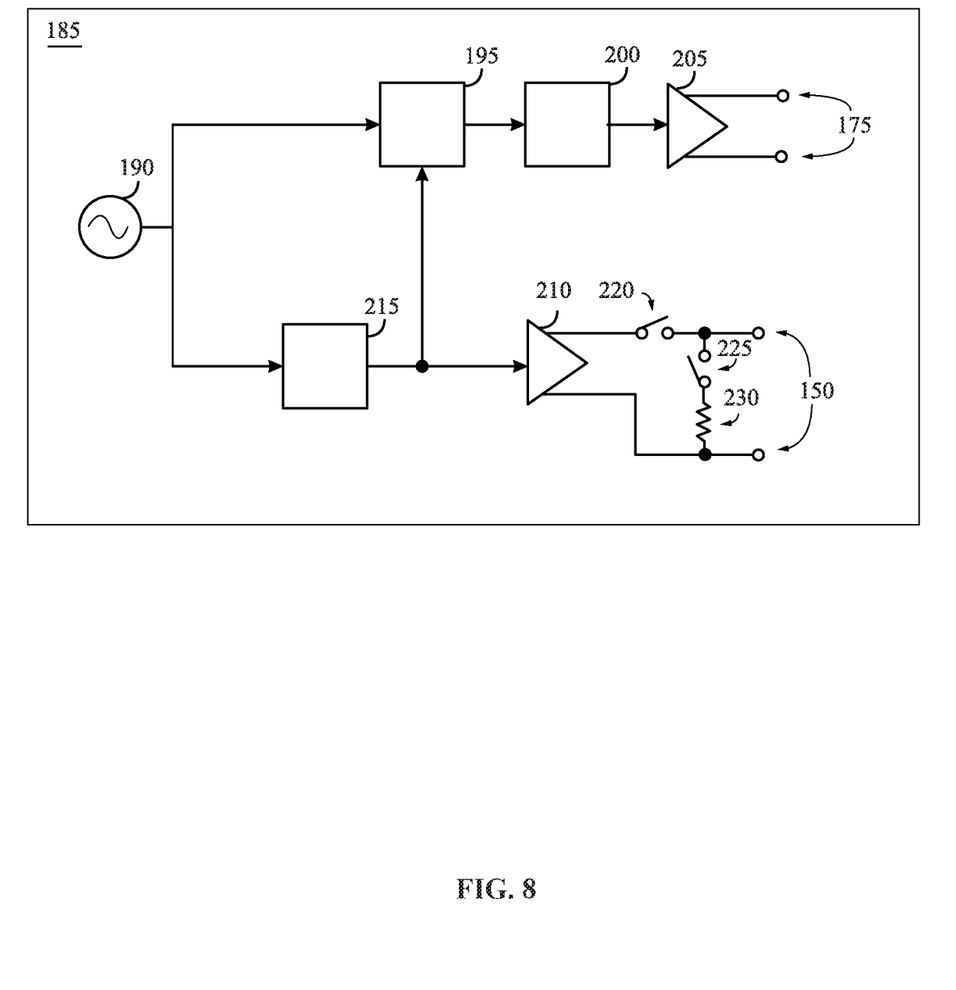

An exemplary diagram view of the electronic signal processing and amplification system 185 of the dual-mode acoustic radiator speaker system 100 is shown in FIG. 8. Within the dual-mode acoustic radiator speaker system 100, a signal 190 is supplied to the electronic signal processing and amplification system 185. In some embodiments, the signal 190 originates from the input of the input device. In some embodiments, the electronic signal processing and amplification system 185 comprises a first signal processing unit 200 programmed with a first set of transfer functions to drive the active speaker driver 103. Next, a second signal processing unit 215 is programmed with a second set of transfer functions to drive the dual-mode radiator 101. Next, a signal prediction processing unit 195 is connected to the first signal processing unit 200 and the second signal processing unit 215. In some embodiments, the signal prediction processing unit 195 serves as an acoustic coupler between the first signal processing unit 200 and the second signal processing unit 215. In some embodiments, the signal prediction processing unit 195 is programmed with a third set of transfer functions and a fourth set of transfer functions to manipulate the dual-mode radiator 101 or the active speaker driver 103, respectively. In some embodiments, the electronic signal processing and amplification system 185 further drives the respective value at least one of a control set consisting of: amperage, voltage, polarity, any physically aspect supplied by the first motor assembly 165, and any physical aspect supplied by the second motor assembly 145. In some embodiments, the electronic signal processing and amplification system also includes a first signal amplifier 205 connected to the active speaker driver 103, a second signal amplifier 210 connected to the dual-mode radiator 101, and a mode circuit having a first switch 220, a second switch 225 and a resistor 230. A mode circuit configures an operational mode of the dual-mode radiator 101. In different operational modes, the mode circuit controls power supplied to the dual-mode radiator 101. The first and or second switch may be any switch known in the art, including but not limited to mechanical, bi-directional, at least one MOSFET, electromechanical, or solid-state relay.

In some embodiments, within the mode circuit, the dual-mode radiator 101 is connected to the second signal amplifier 210 by the first switch 220 and therein controls the dual-mode radiator 101 to perform as an active radiator. In some embodiments, within the mode circuit, the first switch 220 is opened and the second switch 225 is shorted and connects the dual-mode radiator 101 is connected and in parallel with the resistor 230 and therein controls the dual-mode radiator 101 to perform as a passive radiator with dampening.

In some embodiments, within the mode circuit, the first switch 220 is disconnected from the second signal amplifier 210 and therein controls the dual-mode radiator 101 to perform as a passive radiator without electrically induced dampening. In some embodiments, the first switch 220 can also be simulated by setting an output of the second signal amplifier 210 into a tri-state high-impedance mode.

Figure 1:
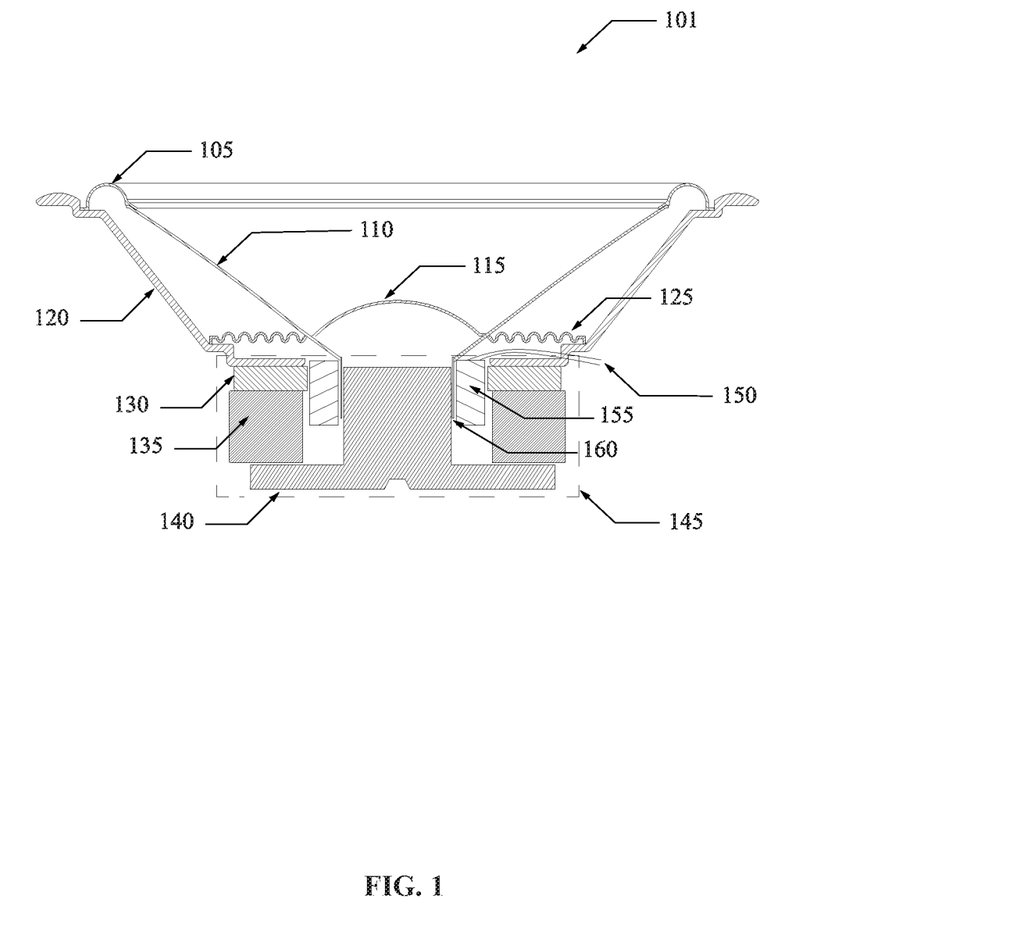
FIG. 1 shows an exemplary cross-sectional view of one embodiment of the dual-mode radiator of the dual-mode acoustic radiator speaker system taken along parting line A-A in FIG. 4.
Figure 2:
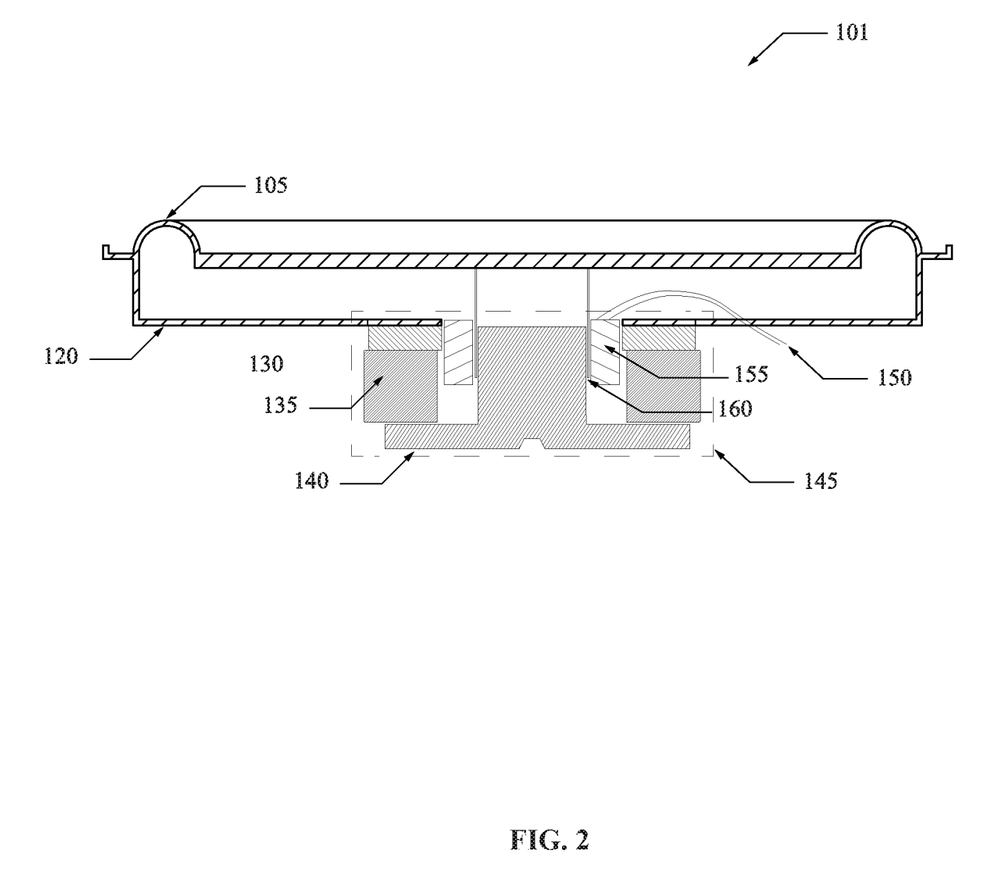
FIG. 2 shows an exemplary cross-sectional view of one embodiment of the dual-mode radiator of the dual-mode acoustic radiator speaker system embodiment taken along parting line A-A in FIG. 4.

FIGS. 1 and 2 shows an exemplary cross-sectional view of one embodiment of the dual-mode radiator 101 of the dual-mode acoustic radiator speaker system 100 taken along parting line A-A in FIG. 7. FIG. 2 shows an exemplary cross-sectional view of one embodiment of the dual-mode radiator 101 having a diaphragm 110 that is flat and FIG. 1 illustrates a dual-mode radiator 101 having the diaphragm 110 embodied in a conical shape. In some embodiments, the dual-mode radiator 101 further comprises a spider 125 to additionally aid in suspending the diaphragm 110 of the dual-mode radiator 101. The exemplary dual-mode radiator 101 shown in FIGS. 1 and 2 comprises a frame 120 with the diaphragm 110 of the dual-mode radiator 101 adjoined to the frame 120 by a surround member 105. The surround member 105 of the dual-mode radiator 101 aides to act a spring restoring mechanism and is non-rigid, assisting in restoring the diaphragm 110 of the dual-mode radiator 101 to a resting position when not powered. In some embodiments, the surround member 105 is made of at least one member of a non-rigid material set consisting of: a rubber material, a composite material, a non-rigid material, a foam material, an elastic material, and a cloth material. The spider 125 of the dual-mode radiator 101 also serves a similar purpose, wherein the spider 125 is adjoined to the frame 120 and the diaphragm 110 of the dual-mode radiator 101 and is non-rigid. The spider 125 assisting in concentrically aligning a resultant motion of the diaphragm 110 when the second motor assembly 145 of the dual-mode radiator 101 is in use. In some embodiments, the resultant motion is induced by the first motor assembly 165 of the active speaker driver 103.

In some embodiments, the spider 125 is made of at least one member of the non-rigid materials set consisting of: a rubber material, a composite material, a non-rigid material, a foam material, an elastic material, and a cloth material. In some embodiment, the diaphragm 110 of the dual-mode radiator 101 may also have a dust cap member 115 adjoined to the diaphragm 110 and concentrically located within the frame 120 of the dual-mode radiator 101. Next, the dual-mode radiator 101 includes the second motor assembly 145 adjoined to the frame 120. The second motor assembly 145 comprises a top plate member 130, a pole member 140, a voice coil 155, and a magnet 135. In some embodiments, the dual-mode radiator 101 comprises a voice coil 155 and former 160 located between and adjoined to the diaphragm 110 and the voice coil 155. In some embodiments, the size and the mass of the voice coil 155 within the second motor assembly 145 of the dual-mode radiator 101 is greater than the size and the mass of the voice coil 155 within the first motor assembly 165 of the active speaker.

In some embodiments, the signal prediction processing unit 195 of the electronic signal processing and amplification system 185 is programmed with a third set of transfer functions to generating a counter-signal to the first signal processing unit 200 and the first signal amplifier 205. In doing so, the counter-signal will drive the active speaker driver 103. The counter-signal therein cancels undesirable excitation caused by internal air pressure variations due to the motion of the dual-mode radiator 101 and the one or more passive radiator 102.

In some embodiments, the programmed transfer functions of first signal processing unit 200 and signal prediction processing unit 195 will be different with respect to the status of the first switch 220 and the second switch 225. In some embodiments, the programmed transfer functions of second signal processing unit 215 will be different with respect to the status of first switch 220 and the second switch 225.

Figure 3:
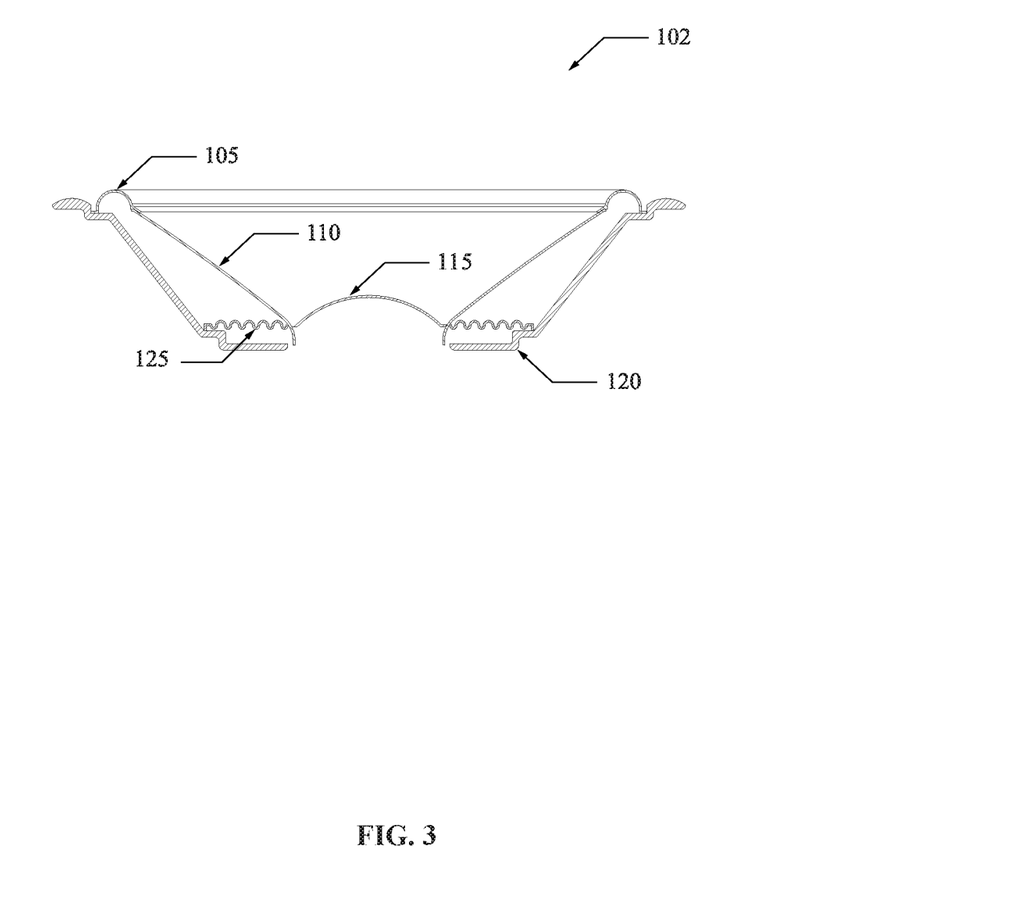
FIG. 3 shows an exemplary cross-sectional view of one embodiment of the one or more passive radiators of the dual-mode acoustic radiator speaker system taken along parting line A-A in FIG. 4.
Figure 4:
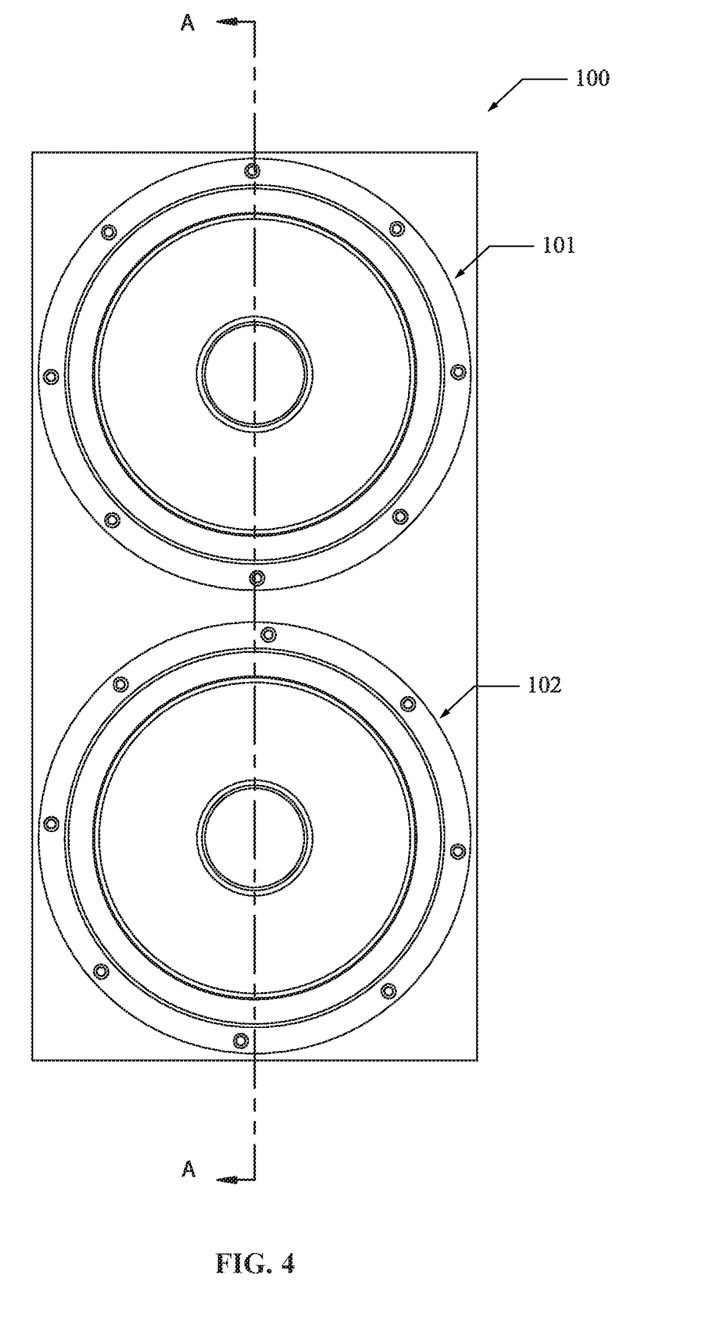
FIG. 4 shows an exemplary cross-sectional view of one embodiment of the dual-mode acoustic radiator speaker system.
Figure 5:
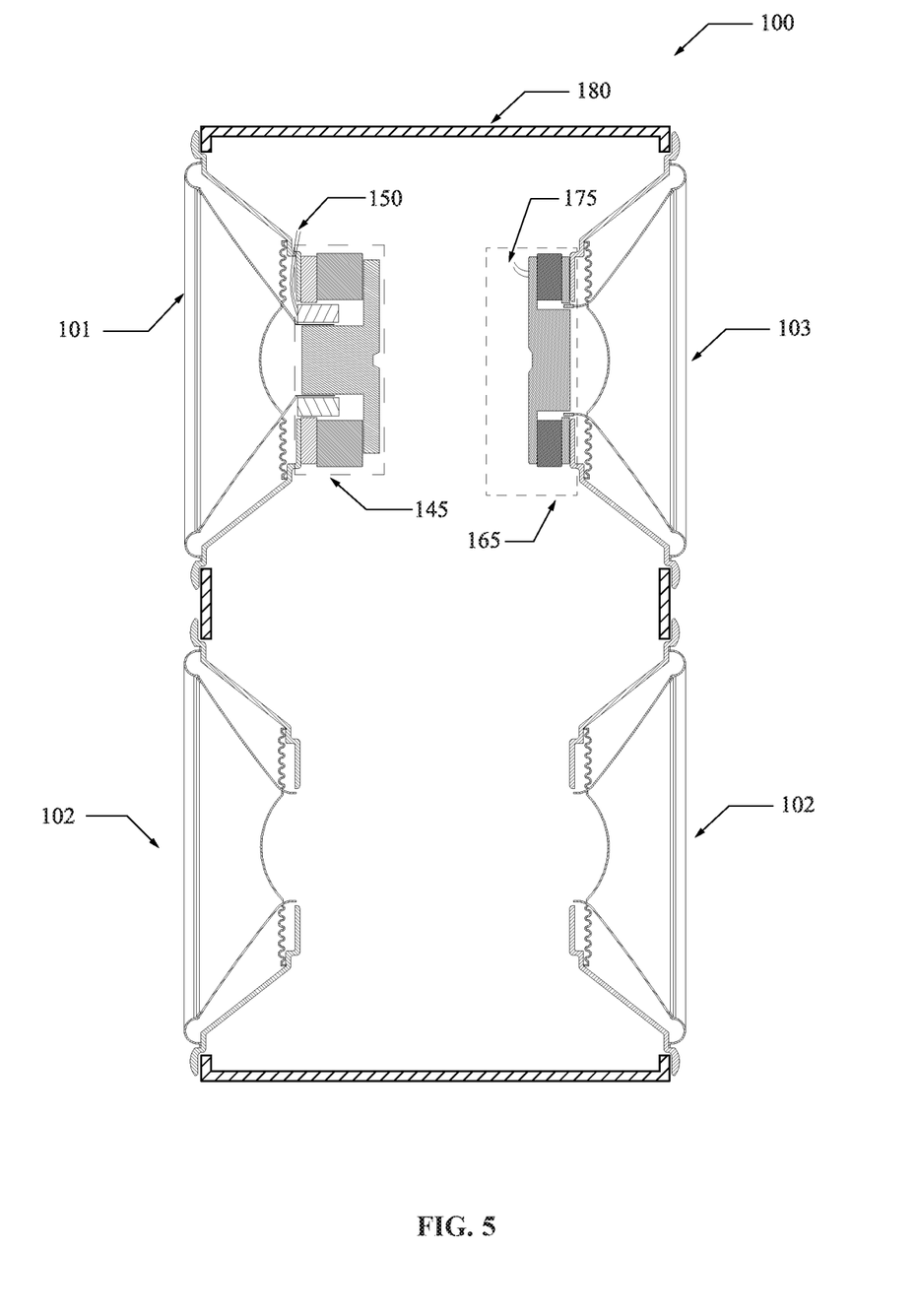
FIG. 5 shows an exemplary cross-sectional view of one embodiment of the dual-mode acoustic radiator speaker system.
Figure 6:
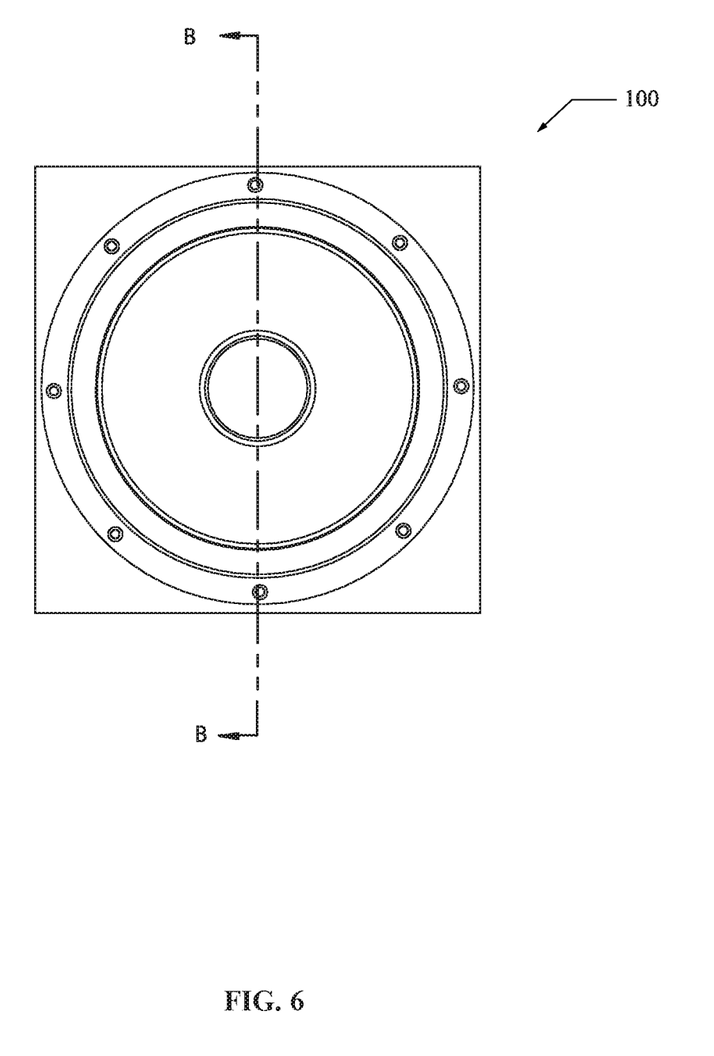
FIG. 6 shows an exemplary front view of one embodiment of the dual-mode acoustic radiator speaker system.
Figure 7:
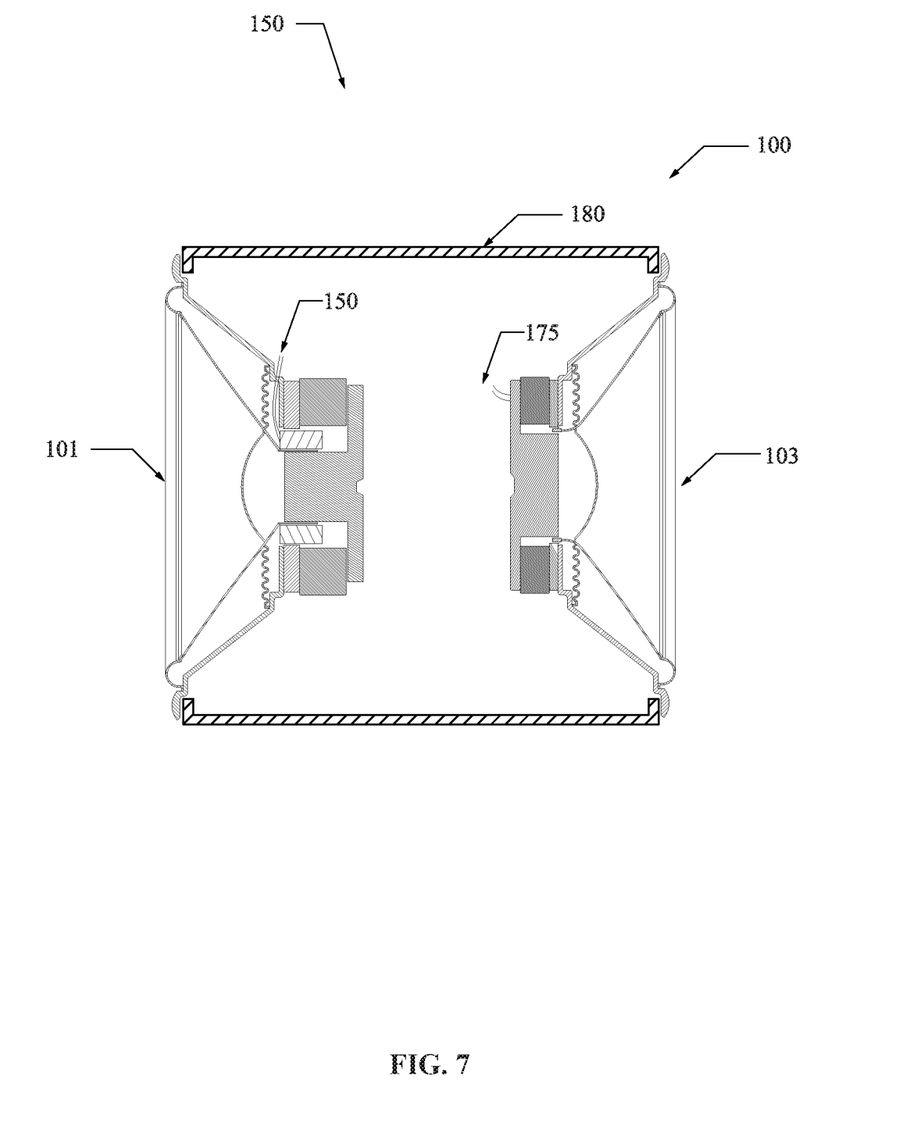
FIG. 7 shows an exemplary cross-sectional view of one embodiment of the dual-mode acoustic radiator speaker system taken along parting line B-B in FIG. 6; and, FIG. 8 shows an exemplary diagram view of the electronic signal processing and amplification system of the dual-mode acoustic radiator speaker system.

FIG. 3 shows an exemplary cross-sectional view of one embodiment of the one or more passive radiators 102 of the dual-mode acoustic radiator speaker system 100 taken along parting line A-A in FIG. 4. The one or more passive radiators 102 comprising no electrically driven components. The one or more passive radiators 102 also having a surround member 105, a diaphragm 110, a dust cap member 115, a spider 125, and a frame 120. As pressure is altered within the enclosure 180 the diaphragm 110 of the one or more passive radiators 102 is free to move in a direction in and out of the enclosure 180. FIGS. 4-7 shows an exemplary embodiment of the dual-mode acoustic radiator speaker system 100. In some embodiments, the dual-mode acoustic radiator speaker system 100 does not have one or more passive radiators 102 as shown in FIGS. 6 and 7. In some embodiments, the dual-mode acoustic radiator speaker system 100 further comprises one or more passive radiators 102.

In some embodiments, it is critical that resonance frequency values are moderated so that each member of the dual-mode acoustic radiator speaker system 100 possesses a resonance frequency that accumulates to a final frequency response desired. Respectively, the active speaker driver 103 having an active speaker driver 103 resonance frequency, the dual-mode radiator 101 having a dual-mode radiator 101 resonance frequency and the one or more passive radiators 102 each having a passive radiator resonance frequency. In some embodiments, the active speaker driver resonance frequency of the active speaker driver 103 is higher than the dual-mode radiator resonance frequency of the dual mode radiator 101. In some embodiments, the dual-mode radiator resonance frequency of the dual-mode radiator 101 is greater than the passive radiator resonance frequency of the one or more passive radiators 102. In some embodiments, the passive radiator resonance frequency of the one or more passive radiators 102 is the same.

In some embodiments, within the electronic signal processing and amplification system, the first switch 220 is closed, and the second switch 225 is open, therein allowing the dual mode radiator to act as another speaker driver as powered is delivered from the second signal amplifier 210. In this embodiment, the dual-mode acoustic radiator speaker system 100 is able to deliver a high sound pressure level and a wide range of low-frequency sound. In this embodiment, in order to achieve favorable audio playback performance, linear frequency responses and non-linear transfer functions of the first signal processing unit 200 and the second signal processing unit 215 will be different. In this embodiment, the motion of one or more passive radiators 102 is mostly excited by the motion of the dual-mode radiator 101. The air pressure variation inside the enclosure 180 is mostly dominated by the combination of motion between the one or more passive radiators 102 and the dual-mode radiator 101. Next, in some embodiments the signal prediction processing unit 195 will be activated within the electronic signal processing and amplification system and predict variations in air pressure within the internal volume of the enclosure 180 resulting from the combination of all motions of the dual-mode radiator 101 and the one or more passive radiators 102 adjoined the enclosure 180. The signal prediction processing unit 195 then generates a counter-signal to first signal processing unit 200 and then the first signal amplifier 205, such that the counter-signal together with the input signal 190 will drive the active speaker driver 103 proportionally to cancel out an undesirable excitation resulting from air pressure variation within the enclosure 180 imposed on the active speaker driver 103.

In some embodiments, within the electronic signal processing and amplification system, the dual-mode radiator 101 may act as a traditional passive radiator within the dual-mode acoustic radiator speaker system 100. In some embodiments, the first switch 220 is open and the second switch 225 is open, therein allowing the dual-mode radiator 101 to act as another passive radiator with no electrically induced dampening. The dual-mode radiator 101 now acting in conjunction with one or more passive radiators 102 adjoined the same enclosure 180. In this embodiment, the dual-mode radiator 101 is working in conjunction with one or more passive radiators 102 but is operating still at a higher resonance frequency than the other one or more passive radiators 102 also adjoined the same enclosure 180. Power consumption is reduced in this embodiment and the power efficiency is increased. In some embodiments, the second signal amplifier 210 is powered when both the first switch 220 is open, and the second switch 225 is open. In some embodiments, the second signal amplifier 210 is powered off when both the first switch 220 is open, and the second switch 225 is open. In this embodiment, the total quiescent power consumption of the signal 190 processing and amplification system 185 is the lowest, as current supplied to the second signal amplifier 210 is now zero. Consequentially, the maximum sound pressure level of the dual-mode acoustic radiator speaker system 100 is reduced as now only the active speaker driver 103 is working actively. In this embodiment, since the motion of both the dual-mode radiator 101 and the one or more passive radiators 102 is excited by only by the active speaker driver 103, the signal prediction processing unit 195 can be bypassed. Furthermore, in this exemplary embodiment, in order to avoid significant sound pressure level reduction at low-frequency, the passive radiator resonance frequency of the one or more passive radiators 102 of the dual-mode acoustic radiator speaker system 100 can be selected to a slightly lower resonance frequency than the dual-mode radiator 101. In doing so, the phase difference and the partial phase cancellation of the sound between the dual-mode radiator 101 and the one or more passive radiators 102 will be mostly eliminated.

In some embodiments, within the electronic signal processing and amplification system 185, the first switch 220 is open, and the second switch 225 is closed, therein resulting in the dual-mode radiator 101 to act as a dampened passive radiator. In this exemplary embodiment, the second motor assembly 145 of the dual-mode radiator acts to generate electrical power as the voice coil 155 within the second motor assembly 145 vibrates or moves due to pressure changes within the internal volume of the enclosure 180 driven by the active speaker driver 103. In doing so, since the second switch 225 is closed and the electrical power generated from the movement of the voice coil 155 within the second motor assembly 145 of the dual-mode radiator passes through the second switch 225 and the resistor 230, which are in series within the electronic signal processing and amplification system 185. The resultant resistance of the voice coil 155 of the dual-mode radiator 101 and the resistor 230 provide a dampening action that will suppress the vibration of the dual-mode radiator 101 in an accountable degree, reducing the out-of-phase interference to the one or more passive radiators 102 within the dual-mode acoustic radiator speaker system 100. In a preferred embodiment, the value of the resistor 230 is 0 ohms, effectively providing a direct connection. The resultant resonant frequencies of the one or more passive radiators 102, due to the dampening of the dual-mode radiator 101, can be lowered and in doing so produce a greater range of lower frequency sounds. With a greater range of lower frequency sounds the system therein produces a deeper and richer bass sound. In this embodiment, since the motion of both the dual-mode radiator 101 and the one or more passive radiators 102 is excited by only by the active speaker driver 103, the signal 190 prediction unit can be idle or powered off.

In some embodiments, the power supply is at least one member of a power set consisting of: a direct current power supply, an alternating current power supply, a battery, and a solar power supply. In some embodiments, when the power supply comprises a battery to battery may further comprise at least one member of a battery set consisting of: a lithium-ion battery, a nickel metal hydride battery, a nickel-cadmium cell battery, capacitor energy storage pack, and a mechanical energy storage. In some embodiments, the enclosure 180 of the dual-mode acoustic radiator speaker system 100 is made of at least one member of a rigid material set consisting of: a metal, a plastic, a composite, a carbon fiber, a fiberglass, a glass, and a wood material. In some embodiments, the frame 120 of the dual-mode radiator 101 or the frame 120 of the one or more passive radiators 102 of the dual-mode acoustic radiator speaker system 100 is made of at least one member of a rigid material set consisting of: a metal, a plastic, a composite, a carbon fiber, a fiberglass, a glass, and a wood material.

In some embodiments, the electronic signal processing and amplification system is configured to monitor the input device. In some embodiments, the input device (not shown) comprises a Wi-Fi device, a cellular device, a Bluetooth device, a satellite mobile communication device, a radio device, a LoRa device, a WLAN device, a microwave communication device, or any combination thereof. In some embodiments, the input device and the electronic signal processing and amplification system further comprises a communication network that comprises at least one of a Wi-Fi network, a cellular network, a Bluetooth connection, a satellite network, a radio network, a RF network, a LoRa network, a WLAN device, a microwave communication device, or any combination thereof. The communication network, in various cases, is the Internet and/or extranet, or an intranet and/or extranet that is in communication with the Internet. The communication network, in some cases, is a telecommunication and/or data network. Examples of input devices include personal computers (e.g., portable PC), slate or tablet PCs, smartphones, or personal digital assistants. In some embodiments, the input device controls at least one of a control set consisting of: amperage, voltage, polarity, any physical aspect supplied by the first motor assembly 165 and any physical aspect supplied by the second motor assembly 145.

As only the bass reproduction levels were discussed herein, tweeters and mid-range speaker drivers commonly found in speaker systems were not disclosed, discussed, or illustrated, however, these components are essential for complete frequency range sound reproductions as well known in the art. Further, any other omission of potentially necessary components for functional speaker systems not disclosed, discussed, or illustrated may be included with any embodiment herein as well known in the art.

As used in this application, the term "a" or "an" means "at least one" or "one or more."

As used in this application, the term "about" or "approximately" refers to a range of values within plus or minus 10% of the specified number.

As used in this application, the term "substantially" means that the actual value is within about 10% of the actual desired value, particularly within about 5% of the actual desired value and especially within about 1% of the actual desired value of any variable, element or limit set forth herein.

All references throughout this application, for example patent documents including issued or granted patents or equivalents, patent application publications, and non-patent literature documents or other source material, are hereby incorporated by reference herein in their entireties, as though individually incorporated by reference, to the extent each reference is at least partially not inconsistent with the disclosure in the present application (for example, a reference that is partially inconsistent is incorporated by reference except for the partially inconsistent portion of the reference).

Unless otherwise defined, all technical terms used herein have the same meaning as commonly understood by one of ordinary skill in the art to which this disclosure belongs.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Any element in a claim that does not explicitly state "means for" performing a specified function, or "step for" performing a specified function, is not to be interpreted as a "means" or "step" clause as specified in 35 U.S.C. § 112, 6. In particular, any use of "step of" in the claims is not intended to invoke the provision of 35 U.S.C. § 112, 6.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A dual-mode acoustic radiator speaker system for acoustic reproduction comprising:
    an enclosure having an exterior shell and an internal volume, wherein in the enclosure includes a plurality of openings protruding through the exterior shell of the enclosure;
    an active speaker driver having a first motor assembly, wherein the active speaker driver is adjoined to the enclosure and aligned within one of the plurality of openings of the enclosure; a dual-mode radiator having a second motor assembly, wherein the dual-mode radiator is adjoined to the enclosure and aligned within one of the plurality of openings of the enclosure;
    a power supply;
    an electronic signal processing and amplification system positioned inside or outside the enclosure and connected to the power supply, the electronic signal processing and amplification system connected to and configured to drive the active speaker driver and the dual-mode radiator, the electronic signal processing and amplification system comprising:
    a first signal processing unit, wherein the first signal processing unit is programmed with a first set of transfer functions to control the active speaker driver;
    a second signal processing unit, wherein the second signal processing unit is programmed with a second set of transfer functions to control the dual-mode radiator;
    a signal prediction processing unit connected from the second signal processing unit to the first signal processing unit.

2. The system of claim 1, wherein the electronic signal processing and amplification system further comprises:
    a first signal amplifier connected to the active speaker driver;
    a second signal amplifier connected to the dual-mode radiator;
    a mode circuit having a first switch, a second switch and a resistor; wherein the mode circuit is configured to operate the modes of the dual-mode radiator.

3. The system of claim 2, wherein the signal prediction processing unit of the electronic signal processing and amplification system is programmed with a third set of transfer functions to:
    (a) generate a counter-signal to the first signal processing unit; and,
    (b) drive the active speaker driver via the first signal processing unit for canceling out most of the internal air pressure variations from the motions of the dual-mode radiator.

4. The system of claim 1, wherein the enclosure further comprises a port protruding through the exterior shell of the enclosure.

5. The system of claim 2, wherein the first switch is disconnected from the second signal amplifier, such that the first switch controls the dual-mode radiator to perform as a passive radiator.

6. The system of claim 2, wherein the second switch is in parallel with the dual-mode radiator and therein controls the dual-mode radiator to perform as a passive radiator with electrical dampening.

7. The system of claim 2, wherein the first switch is connected from the second signal amplifier, such that the first switch controls the dual-mode radiator to perform as an active speaker.

8. The system of claim 1, wherein the electronic signal processing and amplification system further comprises an input device configured to receive an input.

9. The system of claim 1, wherein the dual-mode acoustic radiator speaker system further comprises a plurality of dual-mode radiators.

10. The system of claim 1, further comprising one or more passive radiators.

11. The system of claim 10, wherein the signal prediction processing unit of the electronic signal processing and amplification system is programmed with a fourth set of transfer functions to:
   (a) generate a counter-signal to the first signal processing unit; and,
   (b) drive the active speaker driver via the first signal processing unit for canceling out most of the internal air pressure variations from the motions of the dual-mode radiator and the one or more passive radiator.

12. The system of claim 2, wherein the transfer function of the first signal processing unit, the transfer function of the second signal processing unit, and the transfer function of the signal prediction processing unit will be altered according to the mode circuit configurations.

\* \* \* \* \*